United States Patent
Kosic et al.

(10) Patent No.: US 8,901,937 B2
(45) Date of Patent: Dec. 2, 2014

(54) FOREGROUND TECHNIQUES FOR COMPARATOR CALIBRATION

(75) Inventors: Stephen Robert Kosic, San Diego, CA (US); Jeffrey Bray, San Diego, CA (US)

(73) Assignee: Analog Devices, Inc., Norwood, MA (US)

( * ) Notice: Subject to any disclaimer, the term of this patent is extended or adjusted under 35 U.S.C. 154(b) by 340 days.

(21) Appl. No.: 13/275,587

(22) Filed: Oct. 18, 2011

(65) Prior Publication Data

US 2013/0093467 A1   Apr. 18, 2013

(51) Int. Cl.
*G01R 35/00* (2006.01)
*H03K 5/24* (2006.01)

(52) U.S. Cl.
CPC .................... *H03K 5/2445* (2013.01)
USPC ............ 324/601; 324/705; 361/56; 341/120; 327/70; 327/307; 367/13

(58) Field of Classification Search
USPC ......... 702/85; 361/56; 367/13; 324/601, 705; 327/307, 70
See application file for complete search history.

(56) References Cited

U.S. PATENT DOCUMENTS

| | | | | |
|---|---|---|---|---|
| 5,028,815 A | * | 7/1991 | Van De Plassche | 327/65 |
| 5,471,208 A | * | 11/1995 | Sauer | 341/120 |
| 5,867,116 A | * | 2/1999 | Nakamura et al. | 341/159 |
| 5,877,719 A | * | 3/1999 | Matsui et al. | 341/155 |
| 5,990,814 A | * | 11/1999 | Croman et al. | 341/118 |
| 6,084,538 A | * | 7/2000 | Kostelnik et al. | 341/120 |
| 6,459,394 B1 | * | 10/2002 | Nadi et al. | 341/120 |
| 6,956,512 B1 | * | 10/2005 | San et al. | 341/120 |
| 7,560,979 B1 | * | 7/2009 | Hsu et al. | 327/539 |
| 7,911,365 B2 | * | 3/2011 | Cao et al. | 341/120 |
| 7,944,286 B2 | * | 5/2011 | Yoo | 327/553 |
| 8,055,228 B2 | * | 11/2011 | Park et al. | 455/226.1 |
| 8,330,632 B2 | * | 12/2012 | Bashirullah et al. | 341/120 |
| 2008/0055145 A1 | * | 3/2008 | Yang | 341/156 |
| 2010/0097260 A1 | * | 4/2010 | Nakajima | 341/159 |
| 2011/0037632 A1 | * | 2/2011 | Lai et al. | 341/120 |
| 2011/0109488 A1 | * | 5/2011 | Nakajima | 341/120 |

* cited by examiner

*Primary Examiner* — Patrick Assouad
*Assistant Examiner* — Sean Curtis
(74) *Attorney, Agent, or Firm* — Kenyon & Kenyon, LLP

(57) ABSTRACT

A method and a device for canceling an offset voltage in an output of a comparator circuit include applying a signal to a first input of the comparator as a function of an initial tap point in a resistor ladder. While the signal is applied to the first input, a nominal voltage is applied to a second input of the comparator, and then an output of the comparator is analyzed. The signal to the first input is changed in response to the analyzing, by accessing a different tap point in the resistor ladder.

18 Claims, 6 Drawing Sheets

| N | Residual Offset (5 mVrms) | Residual Offset (7 mVrms) |
|---|---|---|
| 128 | | +/- 4 mV |
| 256 | +/- 5 mV | +/- 3 mV |
| 512 | +/- 3 mV | +/- 2 mV |
| 1024 | +/- 2 mV | +/- 1 mV |
| 2048 | +/- 1 mV | +/- 1 mV |

FOREGROUND TECHNIQUES FOR COMPARATOR CALIBRATION

BACKGROUND INFORMATION

Electronic components are subject to operating characteristic variations. Although devices may be manufactured according to specification, no manufacturing technique can guarantee uniformity across all devices. In metal oxide semiconductor (MOS) devices, this variation is often manifested as a shifting of a threshold voltage level. For example, in a switched comparator circuit, mismatches in the differential pair and mismatches in the current sources may result in a comparator offset, which is a voltage offset that limits the accuracy of the comparator by affecting the performance of a comparison between an input voltage and a reference voltage. Comparator offsets occur not only as a result of random device mismatches, but are also a function of device size. One known method of reducing offsets is to increase device size. However, this requires increased power to maintain gain-bandwidth and regeneration time. For small, low-power comparators, increasing device size may not be a practical option, so that an offset compensation or cancellation scheme is required.

Comparator offsets may be categorized into two types. A first type, known as DC offset (also referred to herein as a "static" offset) is a more or less constant offset that exists when the comparator circuit is operational. A second type, referred to herein as a "dynamic" offset, occurs when the comparator circuit is switched to output a comparator decision based on the values of the inputs to the circuit. Dynamic offsets may be caused by imbalances in the circuit, such as parasitic capacitances that affect circuit components. Therefore, the causes of dynamic offsets may be unrelated to the causes of static offsets.

Techniques exist to compensate for static offsets. However, dynamic offsets remain a problem.

SUMMARY

Example embodiments of the present invention relate to methods and corresponding devices for calibrating comparators.

According to example embodiments, a signal is applied to a first input of the comparator as a function of an initial tap point (a nominal tap voltage) in a first resistor ladder. At the same time, a nominal voltage is applied to a second input of the comparator. The nominal voltage applied to a second input of the comparator may correspond to a nominal tap voltage of a second resistor ladder connected to the second input of the comparator. The output of the comparator, i.e., the difference between the two comparator inputs, is then analyzed. The signal to the first input of the comparator is then changed in response to the analyzing, by accessing a different tap point in the first resistor ladder. The analyzing and changing are repeated until a threshold condition is reached. In this manner, an optimal tap point is selected for the first resistor ladder.

According to example embodiments, an optimal tap point is also selected for the second resistor ladder in a similar manner to that of the first resistor ladder, by switching the roles of the first and second inputs of the comparator.

According to example embodiments, the threshold condition when optimizing the first resistor ladder is a threshold number of logic level ones counted during a first predetermined number of sampling cycles.

According to example embodiments, the threshold condition when optimizing the second resistor ladder is a threshold number of logic level zeroes counted during a second predetermined number of sampling cycles.

BRIEF DESCRIPTION OF THE DRAWINGS

FIG. 7 is a table showing residual offset versus threshold count and noise.

DETAILED DESCRIPTION OF EXAMPLE EMBODIMENTS

The present invention relates to methods and devices for comparator calibration. Exemplary embodiments of the present invention are described with reference to a comparator used in an analog-to-digital converter (ADC). However, the present invention may be applied towards the calibration of a comparator in other types of circuits. According to the exemplary embodiments of the present invention, comparator offset errors in a switched capacitor flash ADC are compensated for by adjusting the taps of a resistor ladder in a flash portion of the ADC. The calibration occurs during a foreground calibration period. During this period, a first input to each comparator is forced to its nominal threshold voltage level, while a second input of the comparator is set by adjusting a set of resistor ladder taps. The taps are adjusted until a threshold condition is met, at which point it is determined that the comparator is sufficiently calibrated. The calibration compensates for both static and dynamic offsets.

Figure 1:
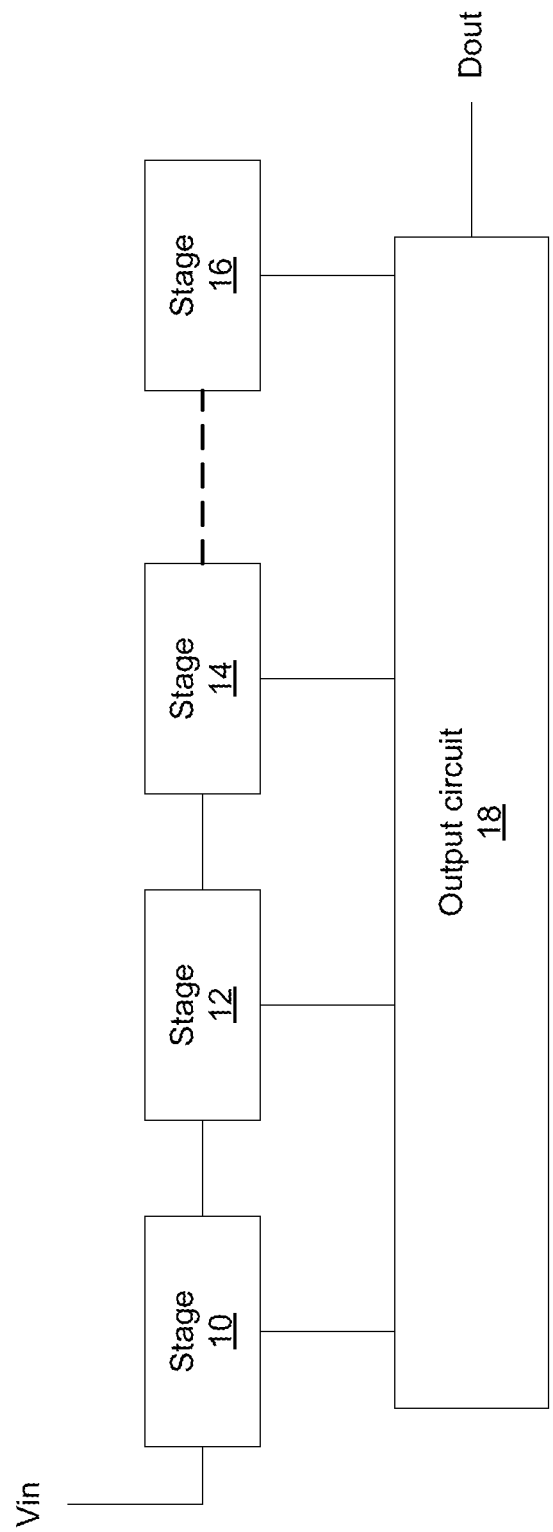
FIG. 1 is a block diagram of a conventional multi-stage pipelined analog-to-digital converter.

FIG. 1 is a block diagram of a conventional multi-stage ADC. An analog signal Vin is input to a first stage (stage 10) of the ADC. Within a flash portion of each stage, a comparison between the input and a set of reference voltages is performed by a bank of comparators, resulting in a coarse digital estimate of the input, which is output to a circuit (output circuit 18). The coarse estimate is also accurately converted to a voltage and subtracted from the input. The resulting residue signal is gained-up and output as the input to the next stage (e.g., stage 12). This is repeated through any number of additional stages (e.g., stages 14 to 16). The overall output of the ADC is then generated by an output circuit 18, which combines the digital output of each stage into a single digital output Dout. At each stage, offset errors may exist that affect the performance of the stage. Since the residue of each stage is passed to the next stage, offset errors may propagate through subsequent stages. Therefore, it may be desirable to apply comparator calibration for each stage.

Figure 2:
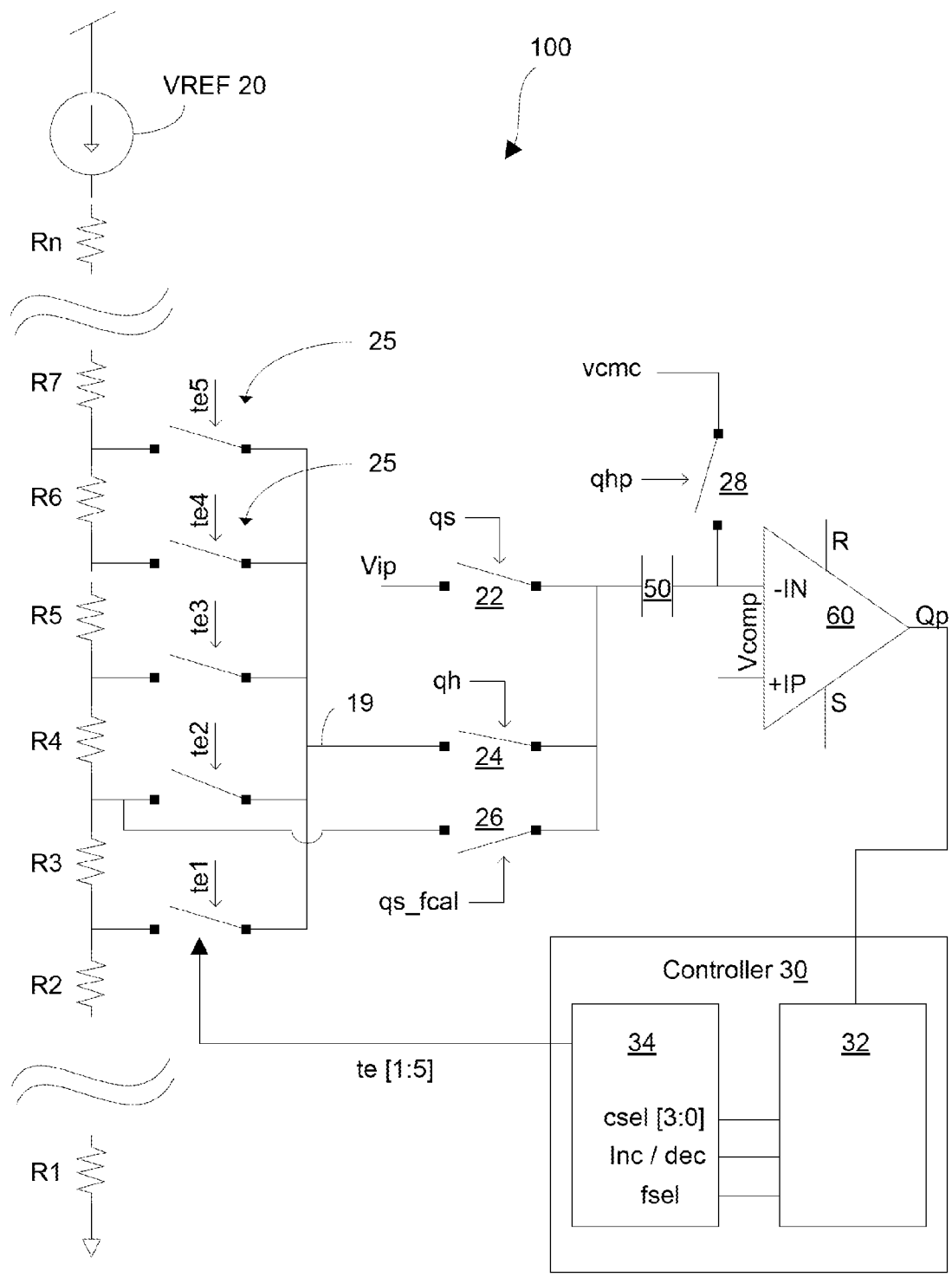
FIG. 2 is a schematic diagram of a circuit for comparator calibration according to an example embodiment of the present invention.

FIG. 2 is a schematic diagram of a circuit 100 for comparator calibration according to an example embodiment of the present invention. The circuit 100 includes a resistor ladder formed by a plurality of resistors, including resistors R1/R2/R3/R4/R5/R6/R7/Rn. The resistor ladder is connected between a reference voltage (VREF 20) and a substrate or ground voltage (e.g., Vss). In an alternative embodiment, VREF 20 can be replaced with a current source. The circuit 100 may also include a plurality of switches 22/24/25/26/28, a comparator 60 and a controller 30. With the exception of the controller 30, the remaining components of the circuit 100 may exist in (i.e., local to) the flash portion of each stage in the ADC of FIG. 1. The controller 30 may be centrally located, e.g., within the ADC.

The resistors R1 to Rn may, but need not have the same resistance value and the nodes between successive resistors form tap points, with different voltages at each tap, e.g., increasing voltage up the ladder from R1 towards Rn.

The switch 24 may be activated in response to a control signal (qh) that signals the beginning of a hold phase of operation in which the capacitor 50 is connected to the common node 19, i.e., to a selected tap voltage. Since the voltage at the common node 19 is typically of opposite polarity to an input voltage Vip, this results in a subtraction of the common node's voltage (i.e., the selected tap voltage) from the input voltage Vip during a subsequent sample phase.

The switches 25 may be activated in response to a digital control signal (te[1:5]) from the controller 30. Each bit of the control signal may activate a respective switch 25 to connect a common node 19 to a respective tap point. Only one switch 25 may be active at a time so that a single tap point is connected to the common node 19. The switch 22 may be activated in response to a control signal (qs) that signals the beginning of the sample phase of operation. During the sample phase, the input signal Vip is applied to the bottom plate of capacitor 50, the top plate of which is connected to a first input terminal −IN of the comparator 60. As a result, the voltage which appears at the input to the comparator is the difference between the input Vip and the selected tap voltage which was sampled onto the cap during the hold phase.

The switch 26 may be activated in response to a control signal (qs_fcal) that operates to connect the capacitor 50 to a predetermined tap point, which corresponds to a nominal tap voltage for the resistor ladder. In one embodiment, the predetermined tap point is a point in the middle of the resistor ladder. However, the location of the predetermined tap point may vary depending on implementation. The location of the predetermined tap point may also change depending on the location of the comparator in the ADC, with different comparators having different predetermined tap points.

The switch 28 may be activated in response to a control signal (qhp) that operates to connect the top plate of the comparator to a common mode voltage (vcmc) during the hold phase. The control signals qh and qhp may be the same except that qhp is de-activated a short time before qh is de-activated, e.g., qhp may be de-activated approximately 100 pS before qh.

The comparator 60 may include a second input terminal +IP. Although not shown in the drawings, it will be understood that the circuitry analogous to that which is connected to the first input terminal −IN may also be provided for the second input terminal +IP. That is, +IP may be connected to a symmetric circuit having elements connected in opposite polarity to the components connected to −IN, so that a complementary input voltage Vin is sampled onto the second input terminal. The comparator 60 generates an digital output signal Qp, which is output to the controller 30.

The controller 30 may include a logic block 32 and a selection block 34. The logic block 32 receives Qp and determines, based on the values of Qp, which tap point(s) to connect the common node 19 to (i.e., it determines which of the switches 25 are activated). The determination based on Qp is described below in connection with exemplary embodiments of a method according to the present invention.

The control signal te[1:5] may be output in response to one or more signals from the logic block 32. In one embodiment, the selection block 34 outputs te[1:5] in response to a set of inputs that include an address signal (csel [3:0]), an increment/decrement signal (inc/dec) and a flash selection signal (fsel). Csel[3:0] is used to address a specific comparator 60 in a specific flash. Fsel is used to select (activate) the flash in which the addressed comparator is located. Inc/dec is used to step through the ladder taps by sequentially activating or deactivating the switches 25. For example, te[1] may be output in response to an initial assertion of inc/dec. Each subsequent assertion of inc/dec may result in a changeover from output of the previous control bit to output of the next control bit (e.g., switching to te[2] after te[1], then switching to te[3] after te[2]). Other control sequences may also be possible for selecting the next tap point.

Figure 3:
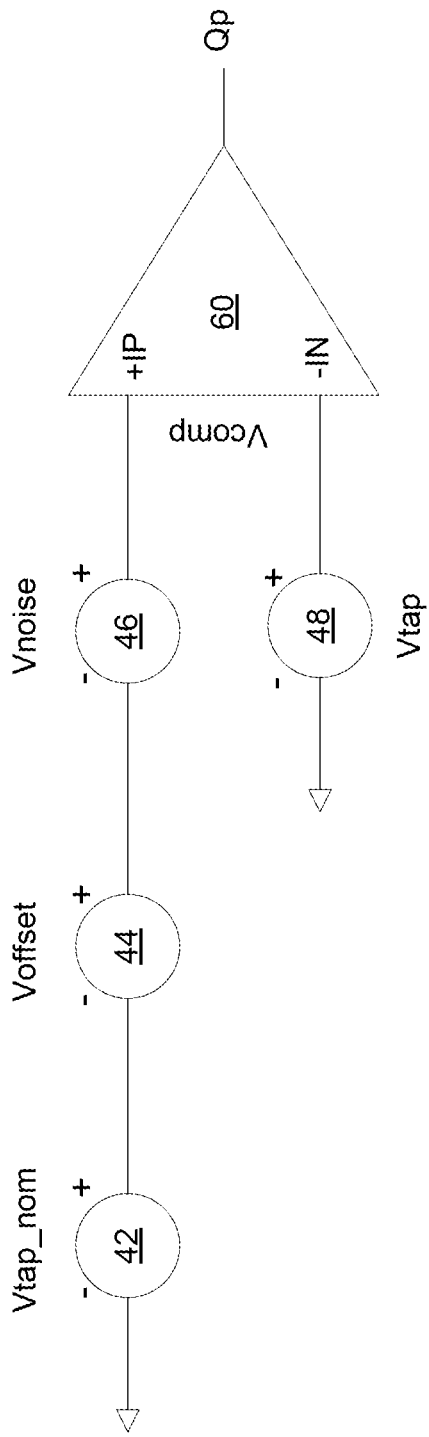
FIG. 3 is a schematic diagram illustrating the net effects of tap voltages and comparator offsets on the output, Qp, of the comparator circuit in FIG. 2.

FIG. 3 is a schematic diagram illustrating the net effects of tap voltages and comparator offsets on the output, Qp, of the comparator circuit in FIG. 2. A voltage source 48 is connected to a first comparator input (e.g., at the terminal −IN) and represents the currently-selected tap voltage. A set of voltage sources 42/44/46 are connected in series to a second comparator input (e.g., at the terminal +IP). The source 42 represents the nominal tap voltage for the circuitry connected to +IP (e.g., the second resistor ladder) (Vtap_nom), the source 44 represents an offset voltage (Voffset) and the source 46 represents a noise source (Vnoise). Each of the voltage sources 42/44/46/48 is a direct current (DC) source. The difference between the voltages at the first comparator input and the second comparator input represents the input (Vcomp) to the comparator 60. Based on the value of Vcomp, the comparator 60 outputs a signal (Qp) that corresponds to a digital "1" or "0". If Vcomp is greater than 0 a digital "1" is output on Qp and if Vcomp is less than 0 a digital "0" is output on Qp.

Figure 4:
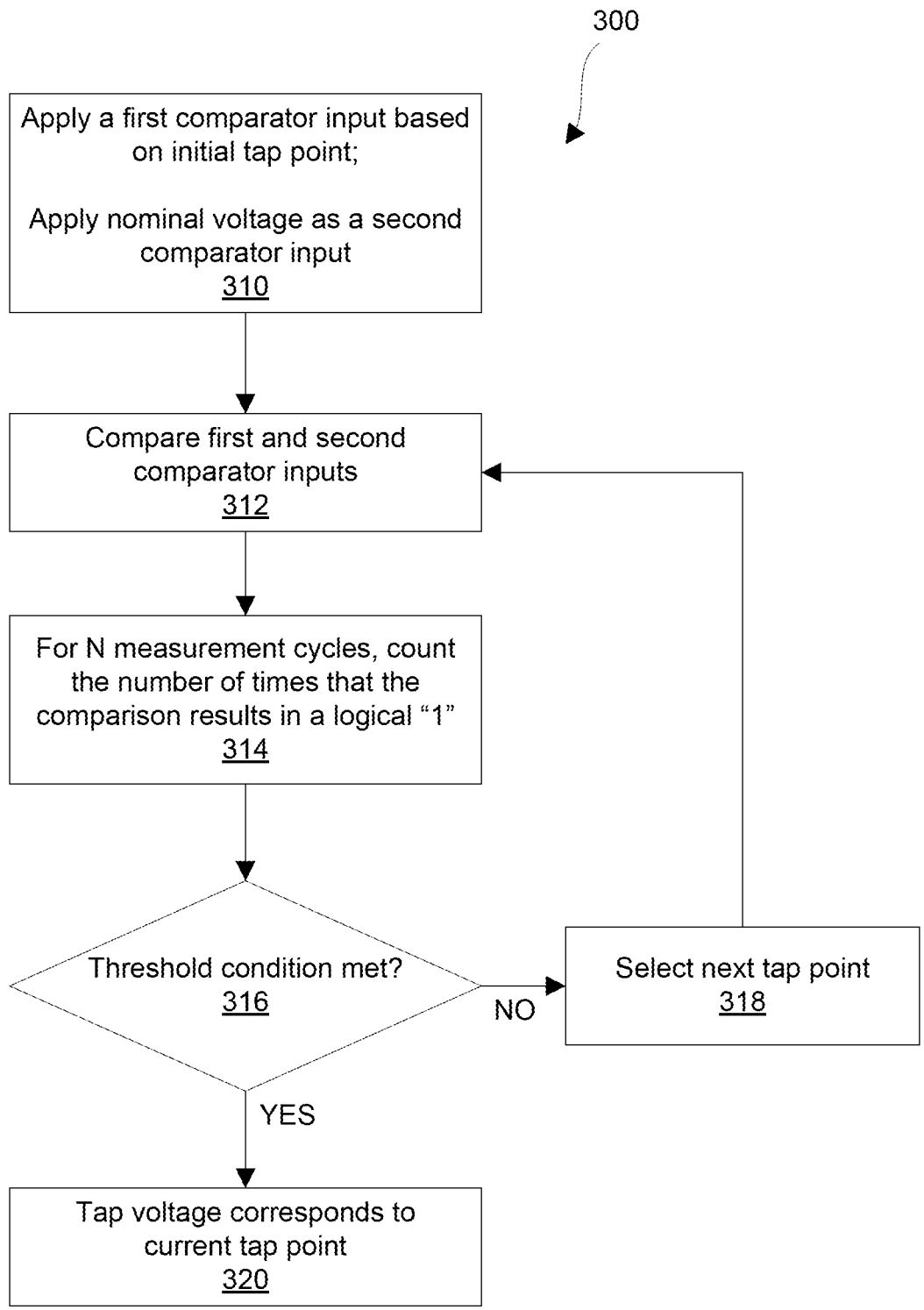
FIG. 4 is a flowchart of a method for comparator calibration according to an example embodiment of the present invention.

FIG. 4 is a flowchart of a method 300 for comparator calibration according to an example embodiment of the present invention. The method 300 may be used in conjunction with the circuit 100. Other circuit arrangements may also be suited for use with this method.

In step 310, the first comparator input (e.g., −IN) is applied based on an initial tap point, e.g., by outputting te[1]. Additionally, the nominal tap voltage for the circuitry connected to +IP is applied as the second comparator input (i.e., as the voltage at +IP). This may be performed by asserting the analogous control signal qs_fcal in the circuitry connected to +IP. In general, the nominal tap voltage for the circuitry connected to +IP is not the same as the nominal tap voltage for the circuitry connected to −IN. Instead, the nominal tap voltage for +IP may be differentially opposite to the nominal tap voltage used for −IN. However, the nominal tap voltages may be equal when the differential reference voltage is 0.

Because the method 300 occurs during the foreground calibration period in which the ADC is not generating useful output, the input Vip is disconnected by deactivating the switch 22 (controlled by qs). Instead of performing a subtraction from Vip as would occur during normal ADC operation, a subtraction is performed between the selected tap voltage applied via the switch 24 (controlled by qh) and the nominal tap voltage applied via the switch 26 (controlled by qs_fcal). In the circuit 100, this corresponds to activating the switch 26 while the switch 22 is deactivated. As a result, the nominal tap voltage for the first resistor ladder is applied to a first input terminal of the comparator 60 (i.e., −IN).

In step 312, the first comparator input is compared to the second comparator input and the comparator 60 outputs Qp to the logic block 32 in the controller 30. This comparison is shown in FIG. 3, which is an illustrative model of the comparator 60 as shown in FIG. 2.

Figure 5:
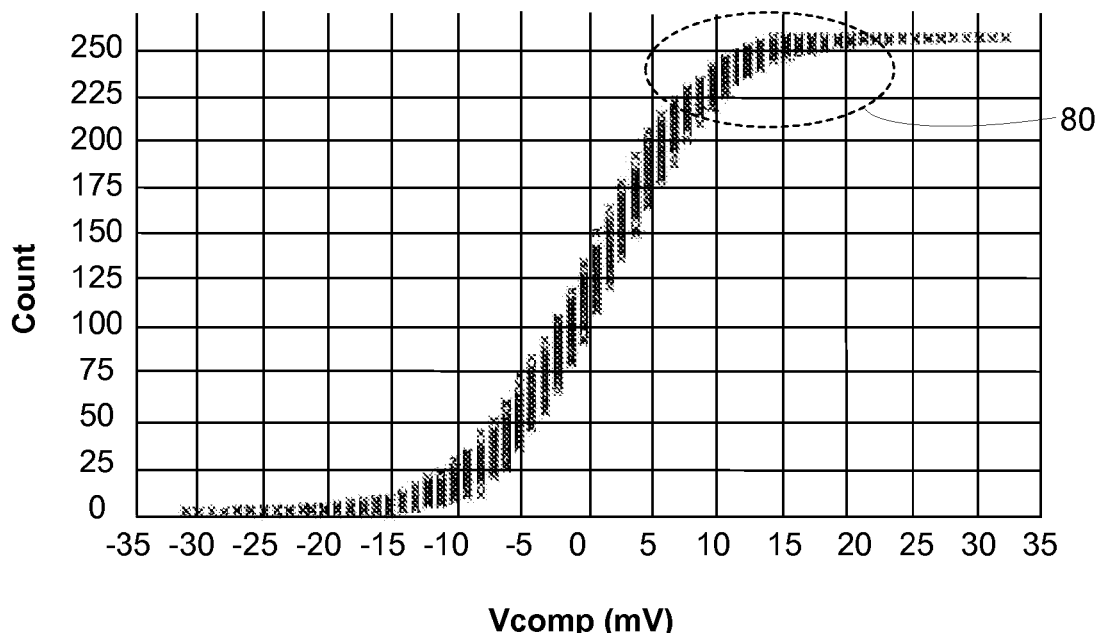
FIG. 5 is an exemplary data plot of results of the circuit in FIG. 3 showing the Qp=1 (threshold) count vs Vcomp (comparator input) in the presence of random Vnoise.

In step 314, the logic block 32 may count the number of times that the comparison results in a logical "1". This may be performed by detecting the voltage level of Qp over a period of N measurement cycles, i.e., Qp is sampled N times. FIG. 5 is an exemplary data plot showing a set of potential results of such sampling. In FIG. 5, the total number of times that Qp is equal to one (Qp=1 count) is plotted against the value of Vcomp when N is equal to 256. Although ideally a step function in the absence of noise, the plot reflects a probability distribution such that, for any given Vcomp value, a set of count values may be produced rather than a single count value. The probability distribution is the result of applying the noise source Vnoise, which can be modeled as a Gaussian distribution.

Figure 6:
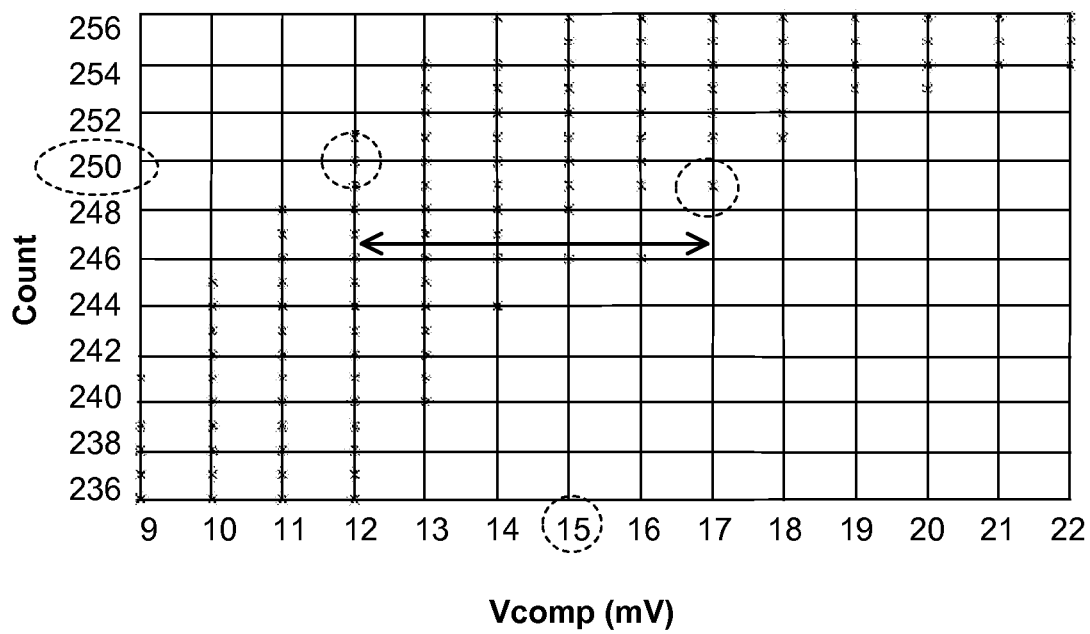
FIG. 6 is a blow-up view of a portion of the data plot in FIG. 5.

In step 316, the logic block 32 determines whether a threshold condition has been met. When the input to which the selected tap voltage is applied is −IN, the threshold condition may be a predetermined count value, e.g., 250. When the input is +IP, the threshold condition may be a threshold number of zero counts, which can also be expressed as a maximum number of one counts. FIG. 6 is a blow-up view of a portion 80 of the data plot in FIG. 5. Because of the probability distribution, any Vcomp value between 12 and 17 mV may be capable of producing a count of 250. In step 316, if the threshold condition is met, the method 300 proceeds to step 320. Otherwise, the method 300 proceeds to step 318.

In step 318, the threshold condition has not been met, so that the next tap point is selected by changing (e.g., incrementing or decrementing) te[1:5]. After changing the tap point, the method 300 returns to step 312, where the first and second comparator inputs are again compared.

In step 320, the threshold condition is met, so that the tap voltage that correctly calibrates the capacitor 60 corresponds to the currently selected tap point, and the method 300 terminates. The controller 30 may maintain the currently selected tap point until the ADC is powered off, e.g., by holding the value of the te[1:5] so that the activation states of the switches 25 remain unchanged throughout normal operations, e.g., while the ADC is performing actual signal conversion.

The method 300 may be performed during a foreground calibration period, e.g., after device power-up, but before the ADC is operational. The method 300 may be repeated for each comparator 60, so that the comparators in each stage of the ADC are calibrated. For example, the comparator of the first stage 10 may be calibrated before moving to the second stage, then the third stage, etc.

Although the method 300 was described with reference to an example embodiment in which the initial tap point is the lowest tap point (corresponding to te[1]), other initial tap points are possible. For example, in another embodiment, the initial tap point may be the highest tap point (e.g., correspond to te[5]). In yet another embodiment, the initial tap point may be an intermediate tap point (e.g., te[2], corresponding to the nominal tap voltage of the first resistor ladder) and the logic block 32 may determine whether to move up or down the ladder based on the count value. For example, counts above a first threshold value may result in incrementing (moving up), whereas counts below the same threshold value may result in decrementing (moving down).

Additionally, the accessing of the tap points need not be sequential, and in particular, need not involve moving to an adjacent tap point. For example, te[1:5] may be incremented by a larger amount when the count is further away from the threshold value, and incremented by smaller amounts as the count approaches the threshold value. If the count overshoots the threshold value, te[1:5] may be decremented in a similarly non-uniform manner.

FIG. 7 is a table showing residual offset that exists after the tap points have been adjusted to the meet the threshold condition, versus the number of sampling cycles (N) and noise (Vnoise). In FIG. 7, residual offset values are shown for two example values of noise (5 mVrms and 7 mVrms). It can be seen that the residual offset is dependent on noise. For example, for a count of 256, the residual offset at 5 mVrms of noise is +/−5 mV, whereas the residual offset is +/−3 mV when the noise is 7 mVrms. This is also shown in FIG. 5, where the residual error for a count of 250 is +/−3 mV. It can also be seen that the residual offset decreases with increasing N. However, it will be understood that there is a performance tradeoff with increasing N, since more time is required for additional sampling cycles.

In the preceding specification, the present invention has been described with reference to specific example embodiments thereof. It will, however, be evident that various modifications and changes may be made thereunto without departing from the broader spirit and scope of the present invention as set forth in the claims that follow. The embodiments described herein may be presented combined with each other in various combinations. The specification and drawings are accordingly to be regarded in an illustrative rather than restrictive sense.

What is claimed is:

1. A method for calibrating a comparator, comprising:
applying a signal to a first input of the comparator as a function of an initial tap point in a resistor ladder;
applying a nominal voltage to a second input of the comparator;
after applying the signal and the nominal voltage, analyzing an output of the comparator; and
changing the signal to the first input of the comparator in response to the analyzing, by accessing a different tap point in the resistor ladder, wherein the changing of the signal to the first input of the comparator reduces an offset of the comparator.

2. The method of claim 1, wherein the analyzing includes sampling the comparator output over a predetermined number of sampling cycles and counting a number of times that the comparator output is equal to logic level one.

3. The method of claim 2, further comprising:
repeating the changing of the signal to the first input of the comparator and the analyzing of the comparator output, until a threshold number of logic level ones are counted during the predetermined number of sampling cycles.

4. The method of claim 2, wherein a direction along the resistor ladder of the different tap point relative to a currently accessed tap point is dependent on a value of the number of logic level ones counted.

5. The method of claim 1, wherein the initial tap point is an intermediate tap point in the resistor ladder.

6. The method of claim 1, wherein the comparator is located in a first stage of a multi-stage analog-to-digital converter (ADC), the method further comprising:
repeating each of the steps of the method for each comparator in the ADC.

7. A method for calibrating a comparator, comprising:
applying a signal to a first input of the comparator as a function of an initial tap point in a resistor ladder;
applying a nominal voltage to a second input of the comparator;
after applying the signal and the nominal voltage, analyzing an output of the comparator; and
changing the signal to the first input of the comparator in response to the analyzing, by accessing a different tap point in the resistor ladder,
wherein a second resistor ladder is associated with the second input of the comparator, the method further comprising:
repeating each of the steps of the method, while switching the roles of the first and the second inputs of the comparator, so that:
another nominal voltage is applied to the first input of the comparator, and
a signal applied to the second input of the comparator is changed by accessing a tap point different from an initial tap point in the second resistor ladder.

8. The method of claim 1, wherein each tap point is accessed via a respective switch that is activated in response to a control signal from a controller circuit.

9. The method of claim 1, wherein the different tap point is adjacent to a currently accessed tap point.

10. A device for calibrating a comparator, comprising:
a circuit arrangement that applies a signal to a first input of the comparator as a function of an initial tap point in a resistor ladder;
a circuit arrangement that applies a nominal voltage to a second input of the comparator; and
a controller performing the steps of:
after the signal and the nominal voltage are applied, analyzing an output of the comparator; and
changing the signal to the first input of the comparator in response to the analyzing, by accessing a different tap point in the resistor ladder, wherein the changing of the signal to the first input of the comparator reduces an offset of the comparator.

11. The device of claim 10, wherein the analyzing includes sampling the comparator output over a predetermined number of sampling cycles and counting a number of times that the comparator output is equal to logic level one.

12. The device of claim 11, wherein the controller repeats the changing of the signal to the first input of the comparator and the analyzing of the comparator output, until a threshold number of logic level ones are counted during the predetermined number of sampling cycles.

13. The device of claim 11, wherein a direction along the resistor ladder of the different tap point relative to a currently accessed tap point is dependent on a value of the number of logic level ones counted.

14. The device of claim 10, wherein the initial tap point is an intermediate tap point in the resistor ladder.

15. The device of claim 10, wherein the comparator is located in a first stage of a multi-stage analog-to-digital converter (ADC), and the controller repeats the analyzing and the changing of the signal for each comparator in the ADC.

16. A device for calibrating a comparator, comprising:
a circuit arrangement that applies a signal to a first input of the comparator as a function of an initial tap point in a resistor ladder;
a circuit arrangement that applies a nominal voltage to a second input of the comparator; and
a controller performing the steps of:
after the signal and the nominal voltage are applied, analyzing an output of the comparator; and
changing the signal to the first input of the comparator in response to the analyzing, by accessing a different tap point in the resistor ladder,
wherein a second resistor ladder is associated with the second input of the comparator, the controller being further configured to:
repeat the analyzing and the changing of the signal, while switching the roles of the first and the second inputs of the comparator, so that:
another nominal voltage is applied to the first input of the comparator, and
a signal applied to the second input of the comparator is changed by accessing a tap point different from an initial tap point in the second resistor ladder.

17. The device of claim 10, wherein each tap point is accessed via a respective switch that is activated in response to a control signal from a controller circuit.

18. The device of claim 10, wherein the different tap point is adjacent to a currently accessed tap point.

* * * * *